(12) United States Patent
Lenz

(10) Patent No.: US 11,919,821 B2
(45) Date of Patent: Mar. 5, 2024

(54) FIBER REINFORCED COMPOSITE AND METHOD OF MAKING

(71) Applicant: RTX Corporation, Farmington, CT (US)

(72) Inventor: Brendan M. Lenz, Wethersfield, CT (US)

(73) Assignee: RTX CORPORATION, Farmington, CT (US)

( * ) Notice: Subject to any disclaimer, the term of this patent is extended or adjusted under 35 U.S.C. 154(b) by 311 days.

(21) Appl. No.: 17/070,083

(22) Filed: Oct. 14, 2020

(65) Prior Publication Data

US 2021/0114941 A1  Apr. 22, 2021

Related U.S. Application Data

(60) Provisional application No. 62/916,894, filed on Oct. 18, 2019.

(51) Int. Cl.
*C04B 35/83* (2006.01)
*B32B 1/08* (2006.01)
(Continued)

(52) U.S. Cl.
CPC ............... *C04B 35/83* (2013.01); *B32B 1/08* (2013.01); *B32B 5/02* (2013.01);
(Continued)

(58) Field of Classification Search
CPC ..... B32B 1/08; B32B 18/00; B32B 2262/105; C23C 16/045; C04B 2237/38; C04B 2237/24; C04B 2237/704; C04B 35/117; C04B 35/14; C04B 35/46; C04B 35/563; C04B 35/583; C04B 35/584; C04B 35/622; C04B 35/80; C04B 35/83; C04B 35/00; C04B 35/185; C04B 35/62873; C04B 35/571; C04B 2235/3217;
(Continued)

(56) References Cited

U.S. PATENT DOCUMENTS

| 5,350,545 A | 9/1994 | Streckert et al. |
| 5,391,428 A * | 2/1995 | Zender .................... C04B 35/80 |
| | | 442/178 |

(Continued)

FOREIGN PATENT DOCUMENTS

| EP | 3590906 A1 | 1/2020 |
| EP | 3725513 A1 | 10/2020 |

OTHER PUBLICATIONS

European Search Report for European Application No. 20202398.2; Application Filing Date: Oct. 16, 2020; dated Feb. 19, 2021; 6 pages.

(Continued)

*Primary Examiner* — Camie S Thompson
(74) *Attorney, Agent, or Firm* — CANTOR COLBURN LLP

(57) ABSTRACT

A void filler material includes a ceramic rod and a fibrous overwrap. The void filler material may be used in a ceramic matrix composite. The method of making the ceramic matrix composite includes inserting the void filler material in voids of a preform and depositing a ceramic matrix on the preform and the void filler material using chemical vapor infiltration.

13 Claims, 3 Drawing Sheets

(51) Int. Cl.
*B32B 5/02* (2006.01)
*C04B 35/628* (2006.01)
*C04B 35/80* (2006.01)
*C04B 35/82* (2006.01)

(52) U.S. Cl.
CPC ........ *C04B 35/62884* (2013.01); *C04B 35/80* (2013.01); *C04B 35/82* (2013.01); *B32B 2262/105* (2013.01); *C04B 2235/3217* (2013.01); *C04B 2235/3244* (2013.01); *C04B 2235/3284* (2013.01); *C04B 2235/3418* (2013.01); *C04B 2235/3813* (2013.01); *C04B 2235/3821* (2013.01); *C04B 2235/3826* (2013.01); *C04B 2235/386* (2013.01); *C04B 2235/3873* (2013.01); *C04B 2235/422* (2013.01); *C04B 2235/446* (2013.01); *C04B 2235/5224* (2013.01); *C04B 2235/5232* (2013.01); *C04B 2235/5236* (2013.01); *C04B 2235/5244* (2013.01); *C04B 2235/5248* (2013.01); *C04B 2235/5256* (2013.01); *C04B 2235/614* (2013.01)

(58) Field of Classification Search
CPC .... C04B 2235/3244; C04B 2235/3418; C04B 2235/3813; C04B 2235/3821; C04B 2235/3873; C04B 2235/5224; C04B 2235/5248; C04B 2235/5256; C04B 2235/5264; C04B 2235/5268; C04B 2235/614; C04B 2235/94; Y10T 428/131; Y10T 428/1314

USPC ........ 428/365, 131, 292; 138/149, 150, 153, 138/172, 174
See application file for complete search history.

(56) References Cited

U.S. PATENT DOCUMENTS

| | | |
|---|---|---|
| 5,881,775 A | 3/1999 | Owen et al. |
| 6,627,019 B2 | 9/2003 | Jarmon et al. |
| 7,066,717 B2 | 6/2006 | Morrison et al. |
| 7,887,300 B2 | 2/2011 | Mazzola et al. |
| 9,103,214 B2 | 8/2015 | McCaffrey |
| 10,017,425 B2 | 7/2018 | Tuertscher et al. |
| 10,107,119 B2 | 10/2018 | Walston |
| 10,267,164 B2 | 4/2019 | Berdou et al. |
| 10,309,242 B2 | 6/2019 | Frey et al. |
| 2002/0180120 A1 | 12/2002 | Corman et al. |
| 2011/0206522 A1 | 8/2011 | Alvanos et al. |
| 2018/0045063 A1 | 2/2018 | Frey et al. |
| 2018/0311708 A1 | 11/2018 | Barrett |

OTHER PUBLICATIONS

European Office Action for EP Application No. 20202398.2, dated Feb. 3, 2023, pp. 1-5.

* cited by examiner

FIBER REINFORCED COMPOSITE AND METHOD OF MAKING

CROSS-REFERENCE TO RELATED APPLICATIONS

This application claims the benefit of U.S. Provisional Application No. 62/916,894, filed Oct. 18, 2019, the disclosure of which is incorporated herein by reference in its entirety.

BACKGROUND

Exemplary embodiments pertain to the art of methods of making fiber reinforced composites and the resulting composites.

Generally, the fiber-reinforcement of otherwise brittle ceramic materials offers significant opportunities to toughen the brittle matrix; therefore, fiber preforms are used as starting material and a ceramic matrix is deposited on and around the fiber preform by methods such as chemical vapor infiltration (CVI, also known as chemical vapor deposition).

The preform typically includes voids at various intersections such as T joints, L joints, and angular intersections. These voids require filler material called a noodle to allow these areas to fully densify during subsequent matrix CVI, and to prevent stress concentration and potential defect propagation (delamination) from occurring in this region. Currently available void filler materials meet some of the existing needs but void filler materials that enhance structural integrity and improve uniformity of thermos-mechanical properties within a composite component are desired.

BRIEF DESCRIPTION

Disclosed is a ceramic matrix void filler material including a ceramic rod and a fibrous overwrap.

In addition to one or more of the features described above, or as an alternative to any of the foregoing embodiments, the ceramic rod is hollow.

In addition to one or more of the features described above, or as an alternative to any of the foregoing embodiments, the fibrous overlap is a unidirectional ceramic fiber fabric, a two dimensional (2D) woven ceramic fiber fabric, or a braided ceramic fiber fabric.

In addition to one or more of the features described above, or as an alternative to any of the foregoing embodiments, the void filler material comprises more than one ceramic rod.

In addition to one or more of the features described above, or as an alternative to any of the foregoing embodiments, the fibrous overwrap has a thickness of 100 to 600 micrometers.

In addition to one or more of the features described above, or as an alternative to any of the foregoing embodiments, the ceramic rod has a width of 1 to 10 millimeters (mm).

In addition to one or more of the features described above, or as an alternative to any of the foregoing embodiments, the ceramic rod includes materials such as carbon (C), silicon carbide (SiC), silicon oxide ($SiO_2$), silicon nitride ($Si_3N_4$), boron nitride (BN), boron carbide ($B_4C$), aluminum oxide ($Al_2O_3$), zirconium oxide ($ZrO_2$), zirconium boride ($ZrB_2$), zinc oxide ($ZnO_2$), molybdenum disulfide ($MoS_2$), and combinations thereof.

In addition to one or more of the features described above, or as an alternative to any of the foregoing embodiments, the fibrous overwrap comprises C, SiC, $SiO_2$, $Al_2O_3$, $ZrO_2$, or a combination thereof.

In addition to one or more of the features described above, or as an alternative to any of the foregoing embodiments, the ceramic rod is hollow and comprises branches.

Also disclosed is a fiber reinforced composite including a preform, a void filler material and a ceramic matrix. The void filler material includes a ceramic rod and a fibrous overwrap.

In addition to one or more of the features described above, or as an alternative to any of the foregoing embodiments, the ceramic rod is hollow.

In addition to one or more of the features described above, or as an alternative to any of the foregoing embodiments, the matrix includes carbon (C), silicon carbide (SiC), silicon oxide ($SiO_2$), silicon nitride ($Si_3N_4$), boron nitride (BN), boron carbide ($B_4C$), aluminum oxide ($Al_2O_3$), zirconium oxide ($ZrO_2$), zirconium boride ($ZrB_2$), zinc oxide ($ZnO_2$), molybdenum sulfide ($MoS_2$), and combinations thereof.

In addition to one or more of the features described above, or as an alternative to any of the foregoing embodiments, the fibrous overlap is a unidirectional ceramic fiber fabric, a 2D woven ceramic fiber fabric, or a braided ceramic fiber fabric.

In addition to one or more of the features described above, or as an alternative to any of the foregoing embodiments, the void filler material comprises more than one ceramic rod.

In addition to one or more of the features described above, or as an alternative to any of the foregoing embodiments, the fibrous overwrap has a thickness of 100 to 600 micrometers.

In addition to one or more of the features described above, or as an alternative to any of the foregoing embodiments, the ceramic rod has a width of 1 to 10 mm.

In addition to one or more of the features described above, or as an alternative to any of the foregoing embodiments, the fibrous overwrap comprises C, SiC, $SiO_2$, $Al_2O_3$, $ZrO_2$, or a combination thereof.

In addition to one or more of the features described above, or as an alternative to any of the foregoing embodiments, the ceramic rod is hollow and comprises branches.

Also disclosed is a method of making a ceramic matrix composite including inserting a void filler material into voids of a preform and depositing a matrix onto the preform and void filler material using chemical vapor infiltration wherein the void filler material comprises a ceramic rod and a fibrous overwrap.

In addition to one or more of the features described above, or as an alternative to any of the foregoing embodiments, the ceramic rod is hollow.

In addition to one or more of the features described above, or as an alternative to any of the foregoing embodiments, the ceramic rod is hollow and has branches.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Described herein is a void filler material useful in making ceramic matrix composites. The preform may have voids for example at or near joints in the preform. Voids may also be found in or near corners. These voids can be difficult to densify. Densification is improved through the use of a void filler material, sometimes known as a noodle. Often the void filler material is pieces of fibrous reinforcement and can still have gaps and voids which are difficult to densify. By creating a void filler material it can be tailored to the specific shape of the void and result in more consistent and uniform densification.

Figure 1A:
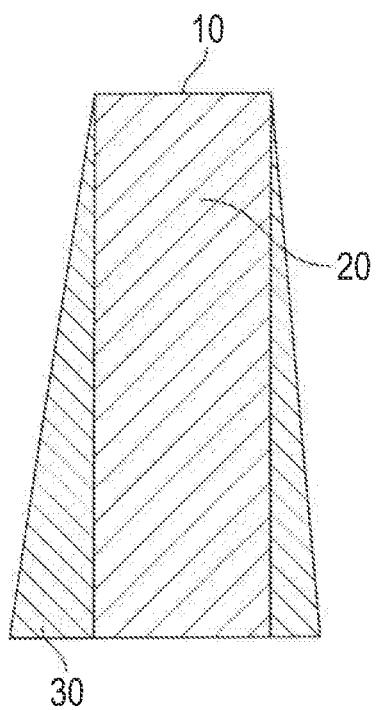
FIGS. 1A and 1B show a void filler material including a solid ceramic rod.
Figure 1B:
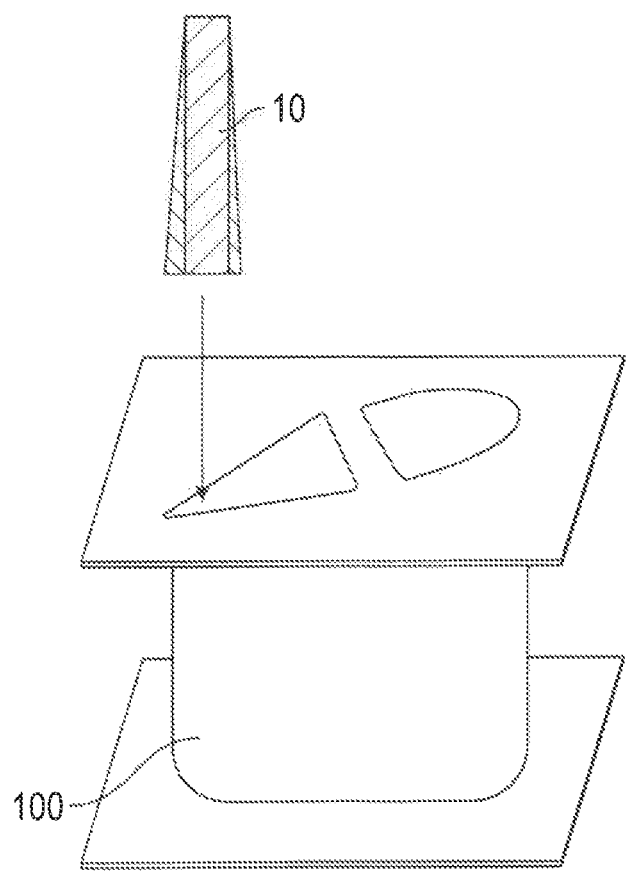

The void filler material includes a ceramic rod and a fibrous overwrap. Void filler material 10 is shown in FIG. 1A where solid ceramic rod 20 is located within fibrous overwrap 30. FIG. 1B shows void filler material 10 being inserted into preform 100.

Figure 2A:
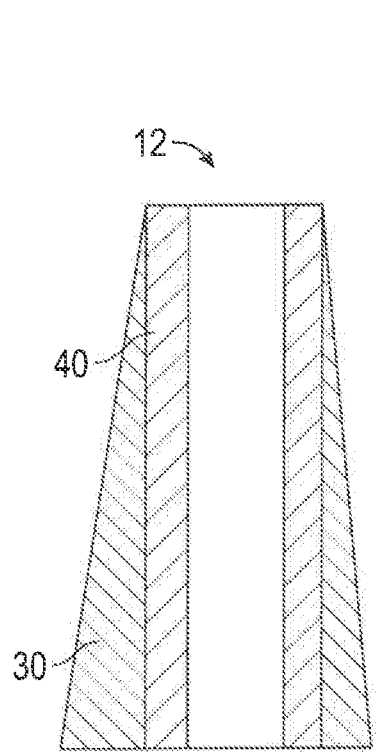
FIGS. 2A and 2B show a void filler material including a hollow ceramic rod.
Figure 2B:
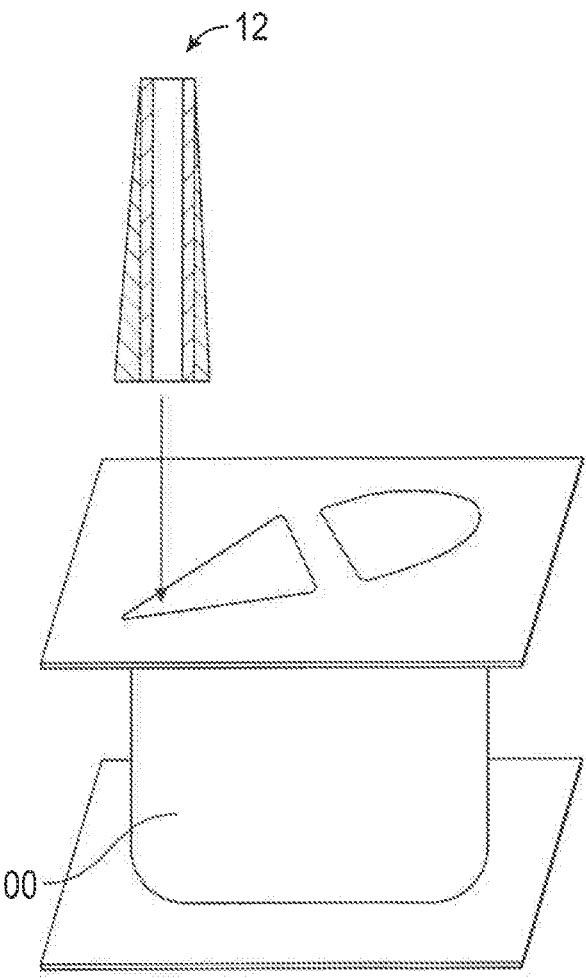

In some embodiments the ceramic rod is hollow and can provide a channel for cooling. Void filler material 12 is shown in FIG. 2A wherein hollow ceramic rod 40 is located within fibrous overwrap 30. FIG. 2B shows void filler material 12 being inserted into preform 100.

The void filler material may include more than one ceramic rod and the ceramic rods may vary in diameter and length as needed. The void filler material may also include a mixture of solid ceramic rods and hollow ceramic rods.

Figure 3A:
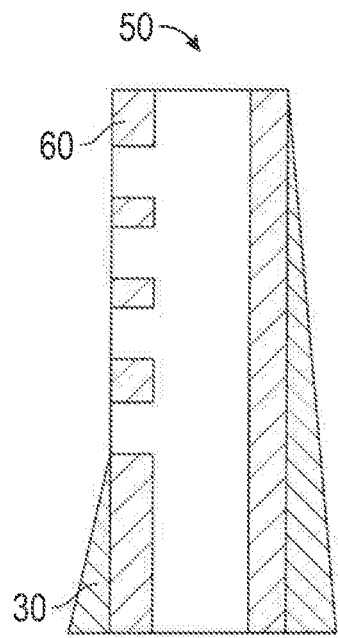
FIGS. 3A and 3B show a void filler material including a hollow ceramic rod with branches.
Figure 3B:
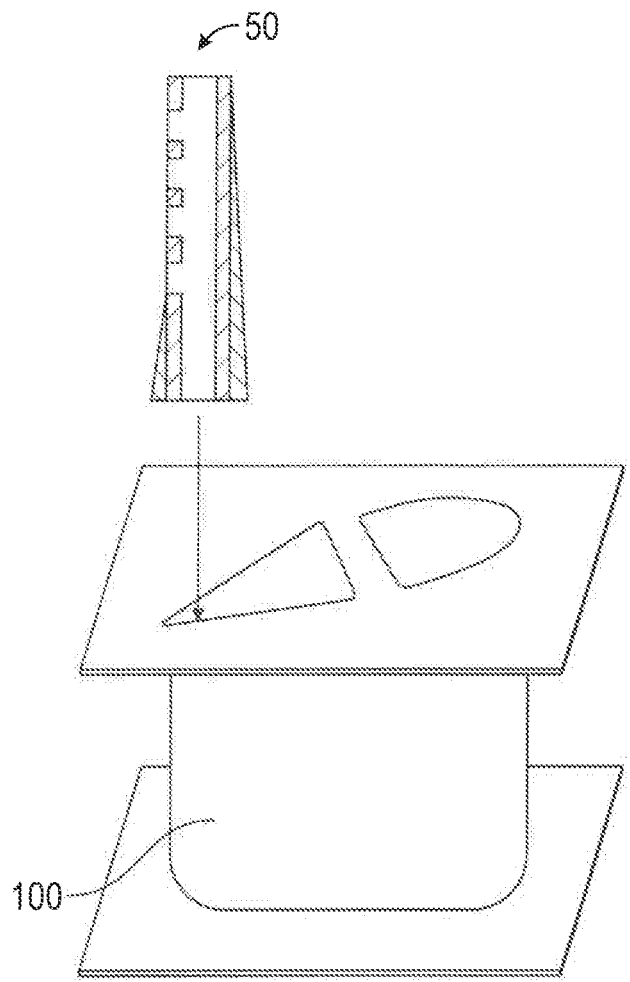

In some embodiments the hollow ceramic rod has branches. These branches allow for cooling over a broader area of the void filler region. FIG. 3A shows a void filler material 50 having a hollow ceramic rod with branches 60 located within fibrous overwrap 30. FIG. 3B shows void filler material 50 being inserted into preform 100.

Exemplary ceramic rod materials include C, SiC, $SiO_2$, $Si_3N_4$, BN, $B_4C$, $Al_2O_3$, $ZrO_2$, $ZrB_2$, $ZnO_2$, $MoS_2$, and combinations thereof. The ceramic rod may have a diameter of 1 to 10 mm and lengths of 2.5 to 254 mm.

Hollow ceramic rods may be made by using chemical vapor infiltration to deposit a ceramic material on carbon fibers or pyrolytic carbon rods. The ceramic material may have a thickness of 2.5 to 6.5 mm. The silicon carbide on carbon fiber or carbon rod combination may then be wrapped with the fibrous overwrap and the carbon fiber or carbon rod removed by thermal decomposition. Alternatively, the carbon fiber or carbon rod is removed first and then the hollow ceramic rod is wrapped. In embodiments where the ceramic rod has branches, two or more carbon fibers, carbon rods or a combination thereof are grafted prior to the ceramic material deposition. After ceramic material deposition the carbon is removed by thermal decomposition, either before or after wrapping in the fibrous overwrap.

Useful fibers for the fibrous overwrap include carbon, silicon carbide, silicon oxide, aluminum oxide, zirconium oxide or combinations thereof. These fibers may have diameters of 5 to 50 micrometers. The overwrap may have a thickness of 100 to 600 micrometers. The overwrap may be a braided fabric, a unidirectional fiber fabric, a 2D woven fiber fabric, or a combination thereof.

A preform is a fiber structure or network and it can be of any suitable character including, but not limited to, woven fiber cloth arrangements, 3-dimensional woven structures, or even random fiber arrangements such as are found in air-laid or water-laid materials. Generally, fibers which are used are in the form of continuous fibrous tows constituting bundles of about 100 to about 3,000 fibers or microfilaments per tow, with the individual fibers, usually having a diameter of about 10 micrometers or less. As employed herein, the term "continuous" refers to fibers or filaments having a substantial length such that they might be woven into a fabric or like 2-dimensional or 3-dimensional structure, if desired. Generally, the fibers that are used are at least about 10 centimeters (cm) in length and between about 5 and about 15 micrometers in diameter. However, larger fibers can be used, e.g. up to about 150 to 200 micrometers in diameter if desired for particular purposes. Exemplary fibers include carbon, $Al_2O_3$—$SiO_2$, SiC, silicon dioxide ($SiO_2$), aluminum silicates, such as mullite, aluminum oxide ($Al_2O_3$), titanium oxide ($TiO_2$), zirconium silicate, silicon nitride and boron nitride (BN), as well as fibers from other high temperature oxides, nitrides, carbides, silicates and the like known in the art of refractory fibers as useful in making composites.

After the void filler material is inserted into the void of the preform the ceramic matrix is deposited by chemical vapor infiltration. Exemplary matrices include C, SiC, $SiO_2$, $Si_3N_4$, BN, $B_4C$, $Al_2O_3$, $ZrO_2$, $MoS_2$, and combinations thereof.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A void filler material comprising:
    a ceramic rod located within a fibrous overwrap;
    wherein the ceramic rod is hollow and comprises branches; and
    wherein the fibrous overwrap has a thickness of 100 to 600 micrometers; and
    wherein the ceramic rod has a width of 1 to 10 mm.

2. The void filler material of claim 1, wherein the branches allow for cooling over an area of a void filler region.

3. The void filler material of claim 1, wherein the fibrous overwrap is a unidirectional ceramic fiber fabric, a 2D woven ceramic fiber fabric, or a braided ceramic fiber fabric.

4. The void filler material of claim 1, wherein the void filler material comprises more than one ceramic rod, each ceramic rod located within the fibrous overwrap.

5. The void filler material of claim 1, wherein the fibrous overwrap comprises C, SiC, SiO2, $Al_2O_3$, $ZrO_2$, or a combination thereof.

6. A fiber reinforced composite comprising:
a preform, a void filler material and a ceramic matrix,
wherein the void filler material comprises a ceramic rod located within a fibrous overwrap; and
wherein the ceramic rod is hollow and comprises branches; and
wherein the fibrous overwrap has a thickness of 100 to 600 micrometers;
wherein the ceramic rod has a width of 1 to 10 mm.

7. The fiber reinforced composite of claim 6, wherein the fibrous overwrap is a unidirectional ceramic fiber fabric, a 2D woven ceramic fiber fabric, or a braided ceramic fiber fabric.

8. The fiber reinforced composite of claim 6, wherein the void filler material comprises more than one ceramic rod, each ceramic rod located within the fibrous overwrap.

9. The fiber reinforced composite of claim 6, wherein the matrix comprises carbon (C), silicon carbide (SiC), silicon oxide ($SiO_2$), silicon nitride ($Si_3N_4$), boron nitride (BN), boron carbide ($B_4C$), aluminum oxide ($Al_2O_3$), zirconium oxide ($ZrO_2$), zirconium boride ($ZrB_2$), zinc oxide ($ZnO_2$), molybdenum sulfide ($MoS_2$).

10. The fiber reinforced composite of claim 6, wherein the fibrous overwrap comprises C, SiC, SiO2, $Al_2O_3$, $ZrO_2$, or a combination thereof.

11. The fiber reinforced composite of claim 6, wherein the branches allow for cooling over an area of a void filler region.

12. A method of making a ceramic matrix composite comprising:
    inserting a void filler material into voids of a preform; and
    depositing a matrix onto the preform and void filler material using chemical vapor infiltration;
    wherein the void filler material comprises a ceramic rod located within a fibrous overwrap;
    wherein the ceramic rod is hollow and comprises branches.

13. The method of claim 12, wherein the branches allow for cooling over an area of a void filler region.

* * * * *